United States Patent [19]

Cook et al.

[11] Patent Number: 5,323,057
[45] Date of Patent: Jun. 21, 1994

[54] LATERAL BIPOLAR TRANSISTOR WITH INSULATING TRENCHES

[75] Inventors: Robert K. Cook; Mario M. A. Pelella, both of Poughkeepsie, N.Y.

[73] Assignee: International Business Machines Coporation, Armonk, N.Y.

[21] Appl. No.: 864,722

[22] Filed: Apr. 7, 1992

Related U.S. Application Data

[62] Division of Ser. No. 733;090, Jul. 19, 1991, Pat. No. 5,187,109.

[51] Int. Cl.$^5$ .............. H01L 27/082; H01L 27/102; H01L 31/11; H01L 23/48
[52] U.S. Cl. .............................. 257/591; 257/592; 257/593; 257/756
[58] Field of Search ............... 257/565, 591, 592, 756, 257/768

[56] References Cited

U.S. PATENT DOCUMENTS 5,083,180  1/1992  Miura et al. ..................... 257/768

FOREIGN PATENT DOCUMENTS 0137906   4/1985  European Pat. Off. .
435308A   3/1991  European Pat. Off. .
4032816   4/1991  Fed. Rep. of Germany .

Primary Examiner—William Mintel
Assistant Examiner—Wael Fahmy
Attorney, Agent, or Firm—Harold Huberfeld

[57] ABSTRACT

A lateral bipolar transistor and method of making which is compatible with making BICMOS circuits are disclosed. The method includes: Forming on a substrate of one conductivity type at least one layer of a semiconductor material of opposite conductivity type. Forming a first region of opposite conductivity type into one portion of the layer and a highly conductive contact region to the layer in another portion, forming a layer of an insulating material over the layer and providing an aperture therethrough to the first region. Depositing a layer of polycrystalline silicon over the insulating layer and in the aperture so that it is in the aperture and extends a short distance beyond the aperture but not beyond the edge of the first region. Ion implanting a dopant of the opposite conductivity type into the polycrystalline silicon and into the portion of the first region which extends beyond the edge of the polycrystalline to form a second region of opposite conductivity type in the layer and around the first region. Annealing the substrate to drive the dopant from the conductive layer into the first region to form a third region of opposite conductivity type.

1 Claim, 3 Drawing Sheets

LATERAL BIPOLAR TRANSISTOR WITH INSULATING TRENCHES

RELATED APPLICATIONS

This application is a division of application Ser. No. 07/733,090, filed on Jul. 19, 1991, now U.S. Pat. No. 5,187,109.

FIELD OF THE INVENTION

The present invention relates to a lateral bipolar transistor and method of fabricating the transistor, and, more particularly, to a lateral bipolar transistor and method of making the same which is compatible with fabricating complementary metal-oxide-semiconductor (CMOS) field effect transistors (FETs) so as to facilitate the fabrication on a single semiconductor substrate of bipolar and CMOS transistors to form a combination bipolar and complementary MOS transistor (BICMOS) circuit.

BACKGROUND OF THE INVENTION

Lateral bipolar transistors, in general, comprise three separate semiconductive regions of alternating conductivity types, such as n-p-n or p-n-p, extending along a common surface of a semiconductor substrate so that all of the electrical contacts to the various regions are at the same surface of the substrate. Such lateral bipolar transistors have many applications, particularly in integrated circuits. Bipolar transistors were generally used in analog circuits whereas MOS transistors were generally used in digital circuits. However, there have been circuits developed which require both MOS transistors and bipolar transistors in a single circuit and on a single substrate. These circuits are generally known as BICMOS circuits. To make such BICMOS circuits, it is necessary to have a fabrication process by which both MOS transistors and bipolar transistors can be formed during a common process sequence.

One type of lateral bipolar transistor is shown and described in the article of S.P. Gaur et al., entitled "Optimum Lateral PNP Transistor," published in *IBM Technical Disclosure Bulletin*, Vol. 26, NO. 9, Feb. 1984, pages 4584 and 4585. However, the lateral bipolar transistor described in this article has a number of problems. It includes a double layer polycrystalline silicon contact system with the first level making contact to the base and the collector and the second level making contact to the emitter. This double level system makes the surface topography thicker so that the photolithograhic process used to form the contacts becomes less accurate. Also, the double level system is not compatible with normal MOS processing so that it would be difficult to make this lateral bipolar transistor in a BICMOS device. Also, this lateral bipolar transistor uses a sidewall spacer to define the spacing across the base region between the emitter region and the surrounding collector region. In forming a sidewall spacer, the thickness of such a sidewall spacer can be changed only a very little amount and its width along the surface of the base region is limited. Therefore, the spacing between the emitter region and the collector region can be varied only a little. Since this spacing controls the beta of the transistor, the beta of this type of lateral bipolar transistor can be varied only over a narrow range and has a maximum value. Thus, the lateral bipolar transistor disclosed in this article is not suitable for use in making some BICMOS integrated circuits and can form transistors having only a limited variation in beta.

Processes have been developed for making BICMOS integrated circuits which include a bipolar transistor disclosed in U.S. Pat. No. 4,808,548 to M. Thomas et al., issued Feb. 28, 1989, and entitled "Method of Making Bipolar and MOS Devices on Same Integrated Circuit Substrate" and in U.S. Pat. No. 4,824,796 to Tzu-Yin Chiu et al., issued Apr. 25, 1989, and entitled "Process for Manufacturing Semiconductor BICMOS Device." However, in the BICMOS circuits of each of these patents the bipolar transistor is a vertical bipolar transistor and not a lateral bipolar transistor.

Therefore, it is desirable to have a method for making bipolar transistors which is compatible with a method for making MOS transistors so as to permit forming BICMOS integrated circuits.

SUMMARY OF THE INVENTION

The present invention is directed toward a lateral bipolar transistor and method of making a lateral bipolar transistor in a semiconductor body which includes forming the emitter of the transistor from a diffusion from a layer of polycrystalline silicon, which layer also serves as the gates of the MOS transistors. Also, the collector region is formed by an ion implantation step which can also form the source and drain of the MOS transistors.

The method of the present invention comprises forming along a surface of a semiconductor body of a first conductivity type a first layer of a second conductivity type opposite to that of the first conductivity. A first region of the second conductivity type is formed in a portion of the first layer. The conductivity of the first region is different than that of the first layer. A second layer of an insulating material is formed over the first layer and the first region. An aperture is formed in the insulating layer over a portion of the first region. A third layer of a conductive material is formed within the aperture and over the insulating second layer extending a short distance from the aperture. An exposed portion of the insulating second layer is then removed to expose a portion of the first layer. A dopant of a second conductivity type is embedded into the conductive third layer and the exposed portions of the first layer so as to form a second region of the first conductivity type around the first region. Annealing drives the dopant from the conductive third layer into the first region to form a third region of the second conductivity type within the first region. This forms a lateral bipolar transistor with the second region serving as a collector, the first region serving as a base, and the third region serving as an emitter.

The present invention is also directed to a lateral bipolar transistor which comprises a semiconductor body of a first conductivity type having along a surface thereof a first region of a second conductivity type opposite that of the first conductivity type. A second region of the second conductivity type, but of different conductivity than the first region, is in a portion of the first region. A layer of an insulating material is on the second region and has an aperture therethrough to a portion of the second region. A third region of the first conductivity type is in the first region and encircles the second region with the third region extending to the second region and at least to an outer edge of the insulating material layer. A fourth region of the first conductivity type is in the second region and under the aperture in the insulating material layer. Separate first level electrical contacts are on each of the first, third, and fourth regions.

The invention will be better understood from the following more detailed description taken with the accompanying drawings and claims.

The drawings are not necessarily to scale.

DETAILED DESCRIPTION

Figure 1:
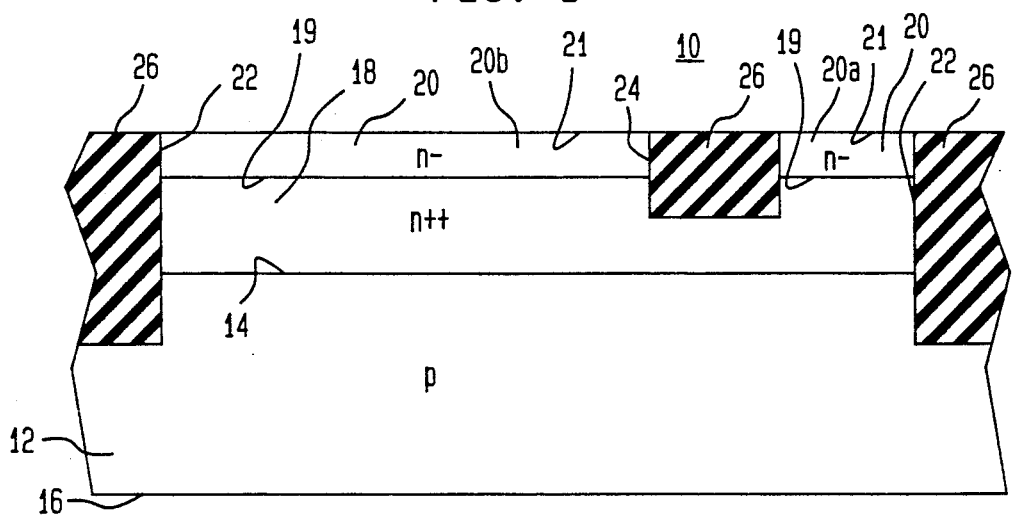
FIGS. 1 through 7 show cross-sectional views illustrating the results of the various steps of a method of making a lateral bipolar transistor in accordance with the present invention with FIG. 7 showing an essentially completed lateral bipolar transistor in accordance with the present invention.

Referring now to FIG. 1, there is shown a cross-sectional view of a semiconductor body 10 formed by the initial steps of a method in accordance with the present invention. The body 10 comprises a substrate 12 of a semiconductor material, such as single crystalline silicon, of one conductivity type, such as p-type conductivity, having a pair of opposed surfaces 14 and 16. The initial steps of the method in accordance with the present invention are to epitaxially deposit on the surface 14 a first layer 18 of single crystalline silicon. The first layer 18, which has a top surface 19, is of a second conductivity type opposite to that of the substrate 12 and of high conductivity, such as n++ type conductivity. A second layer 20, which has a top surface 21 and is of single crystalline silicon, is thinner than the first layer 18 and is epitaxially deposited on the first layer 18. The second layer 20 is of the same conductivity as the first layer 18, but of much lower conductivity, such as n− type conductivity. The first and second layers 18 and 20 may be denoted as a layer which comprises first and second sub-layers.

Spaced apart first and second trenches 22 are then formed through the second layer 20, first layer 18 and into the substrate 12. The trenches 22 are formed by providing a masking layer (not shown) such as of a photoresist, over the surface 21 of the second layer 20 with openings (apertures) in the masking layer where the trenches 22 are to be formed. The exposed areas of the second layer 20, first layer 18, and a portion of the substrate 12 are then removed by any well know etching technique, such as by an anisotropic etching. A third trench 24 is then formed through the second layer 20 and into the first layer 18 between the first and second trenches 22. The third trench 24 is separated from both trenches 22 and is closer to one of the trenches 22 than to the other so that the portion of the second layer 20 between the trenches 22 is divided into a small area 20a and a larger area 20b. The third trench 24 is typically formed in the same manner as the trenches 22. The first and second trenches 22 and the third trench 24 are then filled with an insulating material 26, such as silicon dioxide, using any well known deposition technique, such as chemical vapor deposition. In some applications, the first and second trenches 22 can be filled at a different time from the third trench 24.

Figure 2:
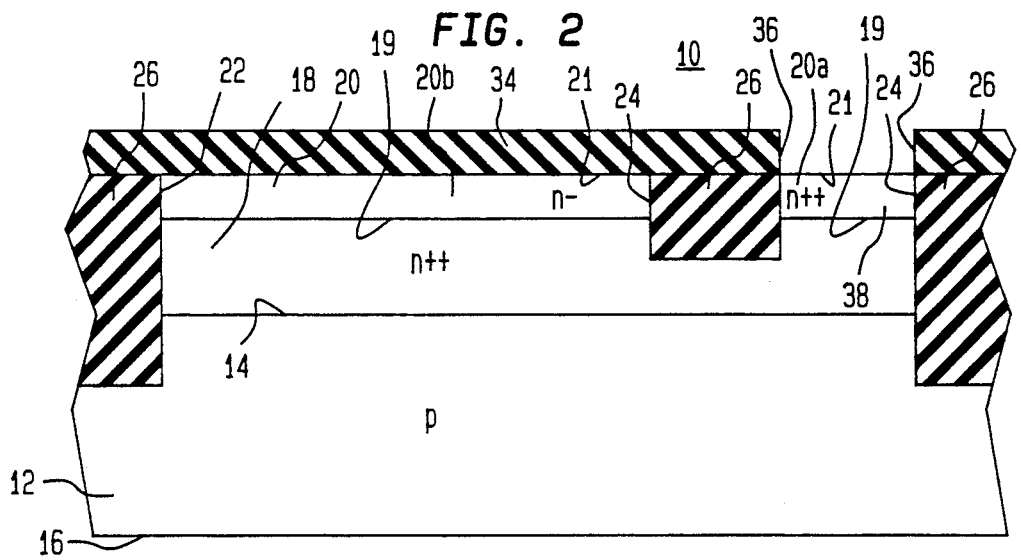

Referring now to FIG. 2, there is shown a cross-sectional view of the body 10 after the next steps of the method in accordance with the present invention are completed. After the trenches 22 and 24 are filled with the insulating material 26, a masking layer 34 of a photoresist material is coated over the surface 21 and provided with an opening (aperture) 36 over the smaller area 20a of the second layer 20. The exposed smaller area 20a of the second layer 20 is then doped with an n-type conductivity dopant of an amount to form a highly conductive n-type conductivity (n++ type) region 38 completely through the smaller area 20a of the second layer 20 to the first layer 18. The highly conductive region 38 serves as a contact region to the first layer 18 which serves as a portion of the base of the transistor being formed. The doping of the smaller area 20a may be by diffusion or ion implantation. The masking layer 34 is then removed with a suitable solvent.

Figure 3:
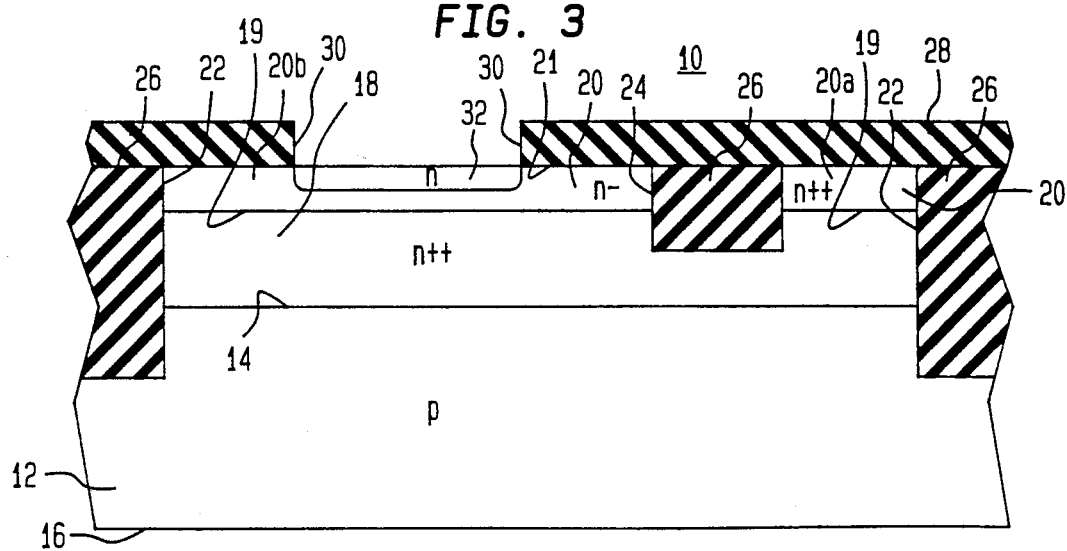

Referring now to FIG. 3, the novel process of the present invention continues with another masking layer 28, such as of a photoresist, being coated over the surface 21 and being provided with an opening (aperture) 30 therethrough over a portion of the larger area 20b of the second layer 20. The exposed portion of the larger area 20b of the second layer 20 is then doped with a dopant of n-type conductivity, such as arsenic or phosphorus, to form in a portion of the area 20b of the second layer 20, a region 32 which is of n-type conductivity and which serves as a portion of the base of the transistor being formed. The doping may be carried out by diffusion or by ion implantation. The masking layer 28 is then removed with a suitable solvent.

Figure 4:
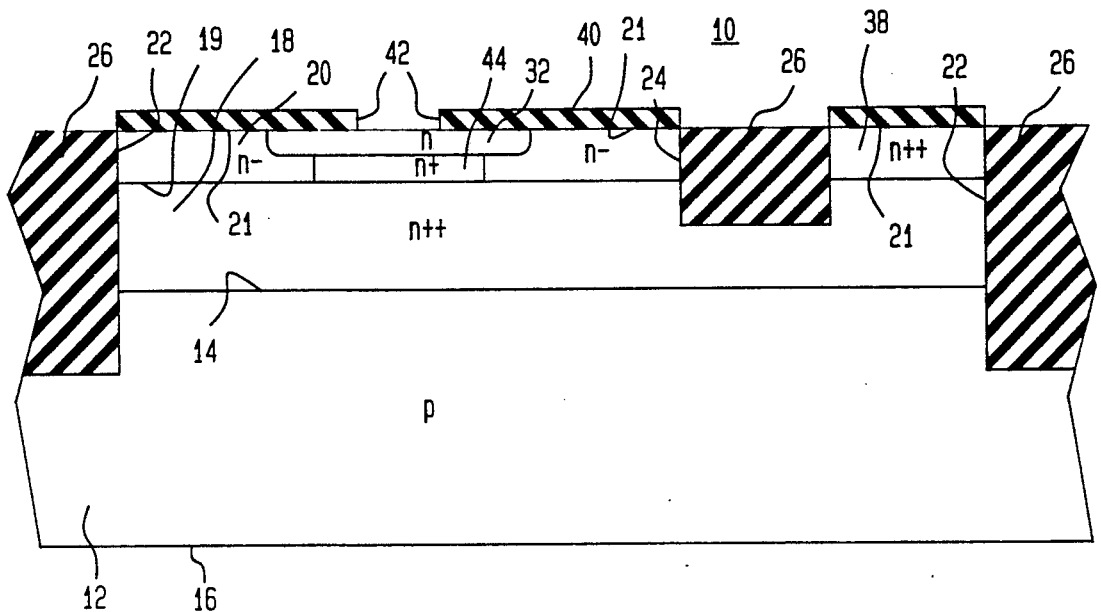

Referring now to FIG. 4, the novel process of the invention continues with a thin insulating layer 40 of silicon dioxide being then formed on the surface 21. This is achieved by heating the body 10 in an atmosphere containing oxygen so as to oxidize the exposed surface of the second layer 20 to silicon dioxide. The insulating layer 40 is of a thickness suitable for the gate oxide of an MOS transistor. An aperture 42 is formed in the insulating layer 40 over the base region 32 using standard photolithographic techniques. A high concentration of ions of an n-type conductivity dopant, such as phosphorus or arsenic, are implanted through the aperture 42 into the layer 20 between the base region 32 and the first layer 18. This forms a highly conductive n+ type deep region 44 between the base region 32 and the layer 18. Region 44 serves with region 32, layer 14 and region 38 as the base of the transistor being formed. The body 10 is heated to activate the ion implantation. This causes the ions in the deep base region 44 to spread out laterally from their implanted positions and form a deep base region 44 which is wider than the aperture 42 in the insulating layer 40.

Figure 5:
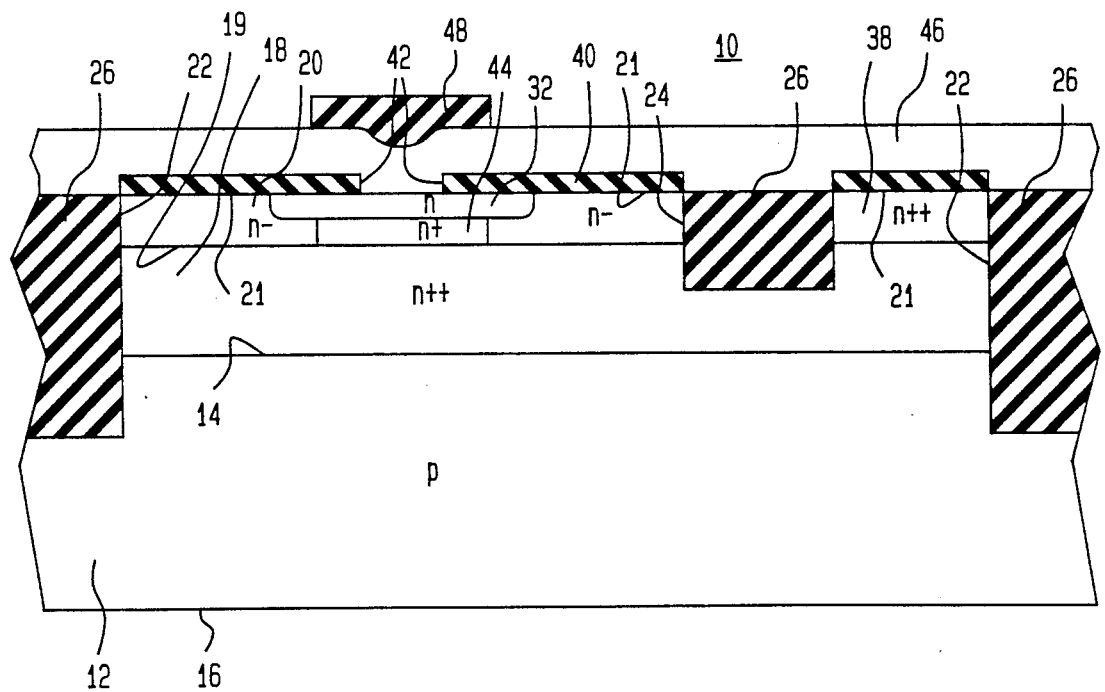

Referring now to FIG. 5, the novel process of the invention continues with a layer 46 of a conductive material, such as polycrystalline silicon, being deposited over the insulating layer 40 and within the aperture 42 so as to completely fill the aperture 42. This may be deposited by any well known technique, such as chemical vapor deposition. A masking material layer 48, such as of a photoresist, is coated over the conductive material layer 46. The masking material layer 48 is defined, using standard photolithographic techniques, to extend over the portion of the conductive material layer 46 which includes the aperture 42 and to extend a short distance from the aperture 42, but not beyond the edge of the base region 32. The masking layer 48 is in the form of a square, circle or similar shape so as to extend completely around the aperture 42.

Figure 6:
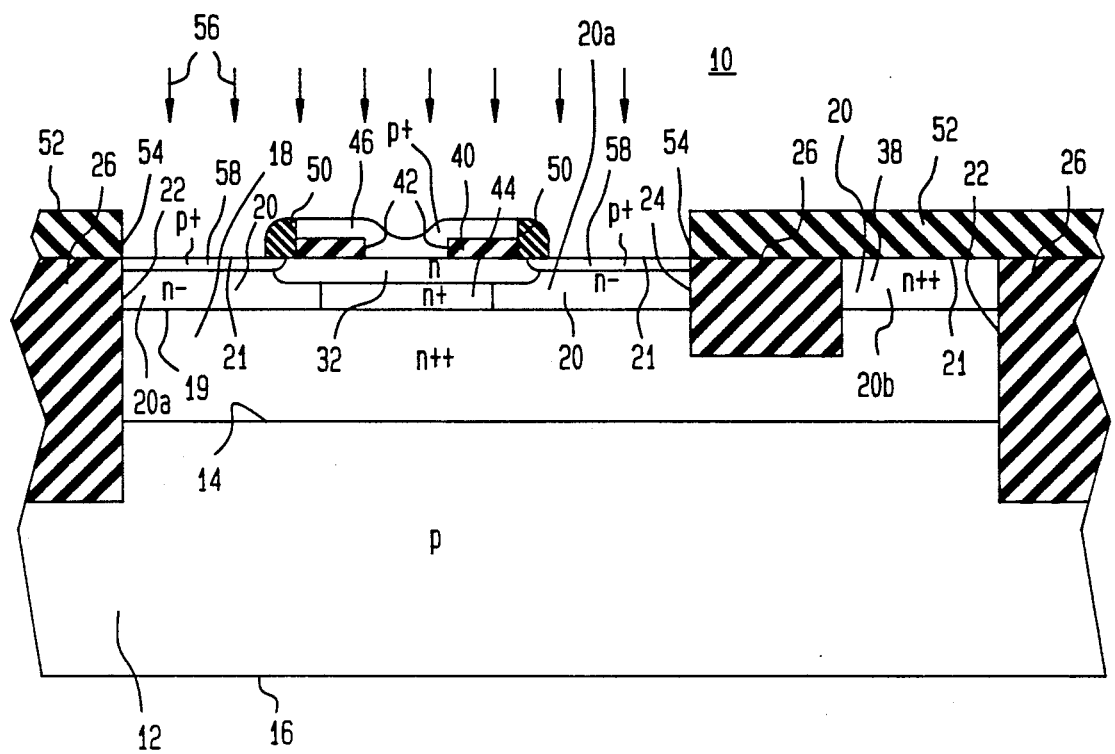

Referring now to FIG. 6, the novel process continue with the exposed portion of the conductive layer 46 being then removed with a suitable etchant. This leaves the conductive layer 46 only in the aperture 42 and extending a short distance over the insulating layer 40 from the aperture 42. This also exposes a portion of the insulating layer 40 around the conductive layer 46 which is then removed with a suitable etchant. The masking layer 48 is then removed with a suitable solvent. A sidewall spacer 50 of an insulating material, such as silicon dioxide, is then formed along the side edges of the conductive layer 46 and the insulating layer 40. This is achieved by the well known technique of depositing by chemical vapor deposition a layer of silicon dioxide (not shown) over the conductive layer 46 and the portions of the surface of the second layer 20 on each side of the conductive layer 46. The silicon dioxide layer is then etched with an anisotropic etch to remove the portions of the silicon dioxide layer which are over the conductive layer 46 and on the surface of the second layer 20. This leaves only portions of the silicon dioxide layer (sidewall spacers) 50 along the side edges of the conductive layer 46 and insulating layer 40.

A masking layer 52 of a photoresist is coated on the surface 21 and provided with an opening (aperture) 54 therethrough which exposes the portion of the second layer 20 between the left hand trench 22 and the trench 24. As indicated by the arrows 56 in FIG. 6, ions of the first conductivity type, such as boron ions of p-type conductivity, are then implanted into the conductive layer 46 and the exposed area of the second layer 20 around the conductive layer 46. This makes the conductive layer 46 highly conductive p-type (p+ type) and forms a highly conductive p-type conductivity region 58 in a portion of the area 20b of the second layer 20 which extends to the surface 21 and encircles the region 32. The p+ type region 58 serves as a collector of the lateral bipolar p-n-p transistor being formed.

Figure 7:
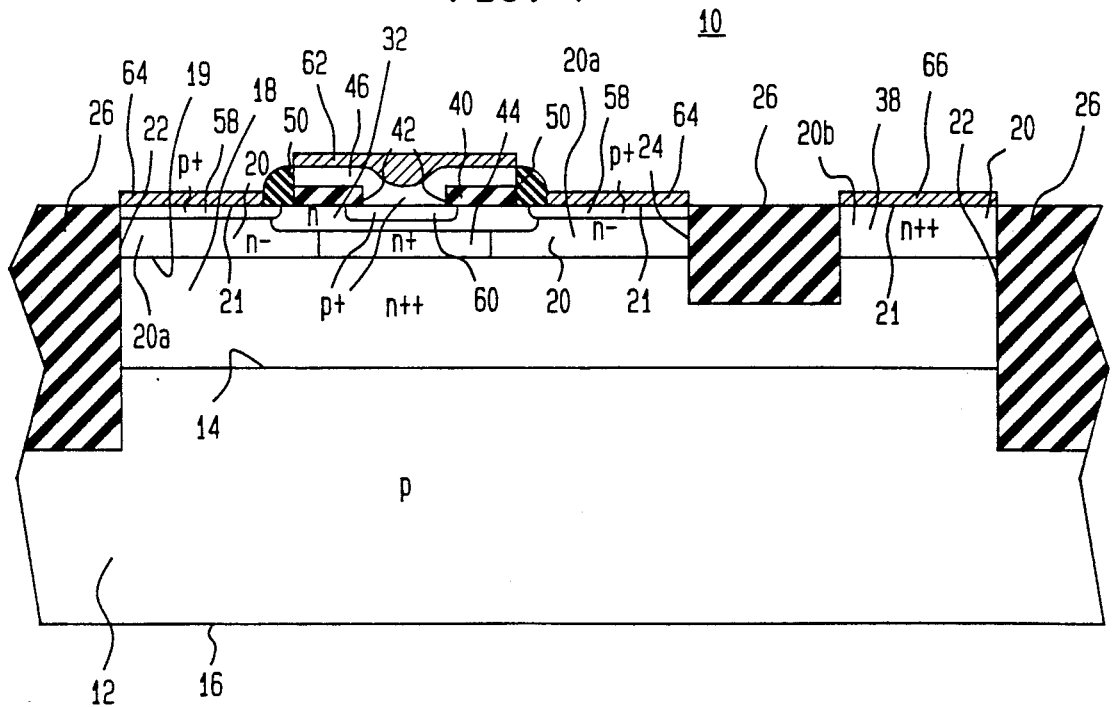

Referring now to FIG. 7, the novel process continues with the body 10 being heated to activate the implanted ions. This heating step also drives some of the p-type dopant from the conductive layer 46 into the base region 32 to form a heavily dope p-type conductivity region 60 (shown as p+) in the base region 32 directly under the conductive layer 46. The region 60 serves as an emitter of the bipolar transistor being formed. Regions 32, 44 and layer 18 serve as the base of the transistor with region 38 serving as a base contact region. Conductive contacts 62, 64 and 66 are then applied to the conductive layer 46, the surface of the collector region 58 and the surface of the base contact region 38, respectively. The conductive contacts 62, 64 and 66 may be of a metal or a metal silicide. The conductive contacts 62, 64 and 66 may applied by coating a metal layer over the device and defining it to form the various contacts or by any well known silicide process.

The resulting structure shown in FIG. 7 is a lateral p-n-p transistor. In a typical lateral p-n-p transistor as shown in FIG. 7, the substrate 12 is about 1000 microns thick and has an impurity concentration of about $10^{15}$ impurities/cm$^3$, the layer 18 is about 2 microns thick and has an impurity concentration of about $10^{20}$ impurities/cm$^3$, the layer 20 is about 0.3 microns thick and has an impurity concentration of about $5 \times 10^{15}$ to $5 \times 10^{17}$ impurities/cm$^3$, the region 58 is about 0.2 microns thick and has an impurity concentration of about $10^{20}$ impurities/cm$^3$, the region 60 is about 0.05 microns thick and has impurity concentration of about $10^{20}$ impurities/cm$^3$, the polycrystalline (polysilicon) region 46 is about 0.3 micron thick and has an impurity concentration of about $10^{20}$ impurities/cm$^3$, the region 38 is about 0.5 micron thick and has an impurity concentration of about $10^{20}$ impurities/cm$^3$, the region 32 is about 0.3 micron thick and has an impurity concentration of about $5 \times 10^{18}$ impurities/cm$^3$, and the region 44 has an impurity concentration of about $5 \times 10^{18}$ to $10^{20}$ impurities/cm$^3$. The width of region 60 is about 1 micron; the width of region 32 on each side of region 60 is 0.4 to 2 microns; the width of region 58 is about 1 micron on each side of region 32; and the width of region 38 is about 1 micron.

The lateral bipolar transistor in accordance with the present invention has only a single level (first-level) of metallization which includes the polycrystalline layer 46 and its contact 62 forming the emitter contact, the collector contact 64 and the base contact 66. This single level metallization reduces the thickness of the surface topography and is compatible with the metallization process for making MOS transistors so as to make the lateral bipolar transistor useful in making BICMOS integrated circuits.

In the lateral bipolar transistor in accordance with the present invention, the spacing along the surface of the base region 32 between the emitter region 60 and collector region 58 is controlled by the formation of openings in the uniformly thick insulating layer 40. This spacing is controlled by the spacing between the opening 42, which defines the emitter region 60 and the etching of the polycrystalline silicon layer 46 and the insulating layer 40, which defines the position of the collector region 58. This spacing can be varied over a wide range so as to permit the formation of a lateral bipolar transistor having a desired beta over a wide range of values. Although the lateral bipolar transistor is shown as having a sidewall spacer 50, this does not control the beta of the transistor and can even be eliminated, if desired. It is only shown since it is automatically provided in a BICMOS process since such sidewall spacers are used in forming the MOS transistors.

Also, in the lateral bipolar transistor in accordance with the present invention, the n+ type region 44 between the base region 32 and the buried base region 18 suppresses the injection of holes into the base region. This suppresses undesired vertical flow of electrons and increases the desired lateral flow. This reduces the base current, base resistance, the stored charge in the base layers, and the parasitic p-n-p isolation current (associated with a parasitic vertical p-n-p transistor having regions 46 and 60 serving as the emitter, regions 32, 38 and 44 and layers 20 and 18 serving as the base, and substrate 12 serving as the collector).

Thus, there is provided a lateral bipolar transistor and method of making a lateral bipolar transistor in a body 10 of a semiconductor material. A number of the steps of the method in accordance with the present invention are the same steps used to make a MOS transistor. For example, when making the trenches 22 for defining the area of the body 10 in which the lateral bipolar is formed, additional trenches 22 can be formed to define the areas of the body 10 in which MOS transistors of a CMOS circuit are to be formed. The thin insulating layer 40 is formed over the entire surface of the second layer 20 and serves as the gate oxide layer for the various MOS transistors as well as a masking layer to define the emitter region of the lateral bipolar transistor. The conductive layer 46 is applied over the entire insulating layer 40 and is defined to form the gates of the MOS transistors as well as the source of the dopant for forming the emitter region 60 and as the contact to the emitter region 60 of the lateral bipolar transistor. The implant used to form the collector region 58 is also used to form the source and drain regions of a MOS transistor having the same conductivity type as the collector region 58. Also, the step or steps of forming the contact 62, 64 and 66 are used to form the contacts to the source, drain and gate of the MOS transistors. Thus, with only a few additional steps the lateral bipolar transistor can be made as part of a standard method of making MOS transistors so as to permit the making of a BICMOS circuit.

It is to be appreciated and understood that the specific embodiments of the invention are merely illustrative of the general principals of the invention. Various modifications may be made consistent with the principles set forth. For example, the conductivity types of the layers and regions can be reversed to form a lateral n-p-n bipolar transistor rather than the lateral p-n-p bipolar transistor shown and described.

What is claimed is:

1. A lateral p-n-p transistor comprising:
    a semiconductor body of p-type conductivity having a surface;
    a first layer of a semiconductor material of n++ type conductivity having a surface and being on the surface of the semiconductor body;
    a second layer of semiconductor material of n− type conductivity having a surface and being on the surface of the first layer;
    the first and second layers and the semiconductor body defining spaced apart first and second trenches which extend through the first and second layers into the semiconductor body, each of the trenches being filled with an insulating material;
    the first and second layers defining a third trench which extends through the second layer into a portion of the first layer and is located between the first and second trenches and is separated therefrom by portions of the first and second layers, the third trench being filled with an insulating material and dividing the first layer into a first portion and a second portion which is smaller than the first portion;
    a first region of n-type conductivity in a portion of the first portion of the second layer;
    a layer of insulating material having an aperture on the surface of the second layer and over the first region;
    a second region of p-type conductivity in the second layer and around the first region, the second region extending to the first region and being located under the insulating layer;
    a third region of p-type conductivity in a portion of the first region and partly under the aperture in the insulating layer;
    a layer of polycrystalline silicon of p-type conductivity on the third region within the aperture in insulating layer and extending away from the aperture;
    a fourth region of n+ type conductivity in a portion of the second layer between the third region and the first layer;
    a fifth region of n++ type conductivity in the second portion of the second layer and extending through the second layer to the first layer; and
    separate first, second, and third first-level contact layers each containing a metal, the first, second, and third contact layers being on the second region, the fifth region, and the polycrystalline silicon layer, respectively.

* * * * *